(12) United States Patent
Song et al.

(10) Patent No.: US 10,958,262 B2
(45) Date of Patent: Mar. 23, 2021

(54) SYSTEM AND METHOD FOR PROTECTING INTER-BATTERY CIRCUIT BY USING FREE WHEELING PATH

(71) Applicant: LG Chem, Ltd., Seoul (KR)

(72) Inventors: Hyeon Jin Song, Daejeon (KR); Wontae Lee, Daejeon (KR); Yanglim Choi, Daejeon (KR)

(73) Assignee: LG Chem, Ltd.

( * ) Notice: Subject to any disclaimer, the term of this patent is extended or adjusted under 35 U.S.C. 154(b) by 352 days.

(21) Appl. No.: 16/070,436

(22) PCT Filed: Jul. 14, 2017

(86) PCT No.: PCT/KR2017/007553
§ 371 (c)(1),
(2) Date: Jul. 16, 2018

(87) PCT Pub. No.: WO2018/012916
PCT Pub. Date: Jan. 18, 2018

(65) Prior Publication Data
US 2019/0020337 A1   Jan. 17, 2019

(30) Foreign Application Priority Data

Jul. 15, 2016  (KR) .................. 10-2016-0090251

(51) Int. Cl.
*H03K 17/0812* (2006.01)
*H02H 7/22* (2006.01)
(Continued)

(52) U.S. Cl.
CPC ..... *H03K 17/08122* (2013.01); *H02H 1/0007* (2013.01); *H02H 7/222* (2013.01);
(Continued)

(58) Field of Classification Search
CPC ...... H02H 1/0007; H02H 7/222; H02H 9/041; H02J 7/0029; H02J 7/0031; H02J 7/1423;
(Continued)

(56) References Cited

U.S. PATENT DOCUMENTS 4,048,520 A * 9/1977 Muskovac ............ H02M 1/084
                                                            327/260
6,421,214 B1 * 7/2002 Packard ................. H02H 3/335
                                                            361/7
(Continued)

FOREIGN PATENT DOCUMENTS

CN          1945922 A       4/2007
CN          101697427 A     4/2010
(Continued)

OTHER PUBLICATIONS

Extended European Search Report including Written Opinion for Application No. 17827986.5 dated Oct. 5, 2018, 8 pages.
(Continued)

*Primary Examiner* — Kevin J Comber
(74) *Attorney, Agent, or Firm* — Lerner, David, Littenberg, Krumholz & Mentlik, LLP

(57) ABSTRACT

The present invention relates to a system and a method for protecting a circuit between batteries, in which counter-electromotive force generated from the lead-storage battery is prevented from being applied to a MOSFET switch when power is cut off through the MOSFET switch in a circuit in which a vehicle lead-storage battery and a lithium polymer battery are connected to each other to prevent the MOSFET switch from overcurrent and prevent current, which leaks from the lead-storage battery when the lead-storage battery is charged, from being conducted to a path other than a determined path in advance.

15 Claims, 3 Drawing Sheets

(51) Int. Cl.
*H02J 7/14* (2006.01)
*H02J 7/00* (2006.01)
*H02J 7/34* (2006.01)
*H02H 9/04* (2006.01)
*H02H 1/00* (2006.01)

(52) U.S. Cl.
CPC ........... *H02H 9/041* (2013.01); *H02J 7/0029* (2013.01); *H02J 7/0031* (2013.01); *H02J 7/1423* (2013.01); *H02J 7/1461* (2013.01); *H02J 7/34* (2013.01); *H02J 7/342* (2020.01)

(58) Field of Classification Search
CPC ............ H02J 7/1461; H02J 7/34; H02J 7/342; H03K 17/08122
USPC ......................................................... 361/91.5
See application file for complete search history.

(56) References Cited

U.S. PATENT DOCUMENTS

| | | | |
|---|---|---|---|
| 2003/0081360 A1* | 5/2003 | Holley | H02H 1/06 361/42 |
| 2003/0210014 A1* | 11/2003 | Jabaji | H02J 7/0031 320/104 |
| 2004/0130298 A1 | 7/2004 | Krieger et al. | |
| 2014/0368155 A1 | 12/2014 | Chen | |
| 2015/0340978 A1 | 11/2015 | Seo et al. | |

FOREIGN PATENT DOCUMENTS

| | | |
|---|---|---|
| CN | 103490451 A | 1/2014 |
| JP | H10336876 A | 12/1998 |
| JP | 3453718 B2 | 10/2003 |
| JP | 4925719 B2 | 5/2012 |
| JP | 2016107923 A | 6/2016 |
| KR | 10-2011-0064055 A | 6/2011 |
| KR | 10-2012-0002317 A | 1/2012 |
| KR | 10-2012-0134434 A | 12/2012 |
| KR | 10-2015-0074815 A | 7/2015 |
| KR | 10-1508180 B1 | 11/2015 |
| KR | 10-1620366 B1 | 5/2016 |
| WO | 03071648 A2 | 8/2003 |

OTHER PUBLICATIONS

International Search Report and Written Opinion for Application No. PCT/KR2017/007553, dated Oct. 18, 2017 (10 Pages).

* cited by examiner

SYSTEM AND METHOD FOR PROTECTING INTER-BATTERY CIRCUIT BY USING FREE WHEELING PATH

TECHNICAL FIELD

This application claims priority under 35 U.S.C. § 119 to Korean Patent Application No. 10-2016-0090251 filed on Jul. 15, 2016 in the Korean Intellectual Property Office, and under 35 U.S.C. § 365 to PCT/KR2017/007553 filed on Jul. 14, 2017, the entire contents of which are incorporated herein by reference.

The present invention relates to a system and a method for protecting a circuit between batteries using a free wheeling path, and more particularly, to a system and a method for protecting a circuit between batteries, in which counter-electromotive force generated from the lead-storage battery is prevented from being applied to a MOSFET switch when power is cut off through the MOSFET switch in a circuit in which a vehicle lead-storage battery and a lithium polymer battery are connected to each other to prevent the MOSFET switch from overcurrent and prevent current, which leaks from the lead-storage battery when the lead-storage battery is charged, from being conducted to a path other than a determined path in advance.

BACKGROUND

In general, in a lithium polymer battery connected to a vehicle lead-storage battery, a lithium polymer battery supports an output of the vehicle lead-storage battery and needs to cut off current generated from the lithium polymer battery when external power is short-circuited.

To this end, such a cut-off operation is performed by using a switching element called a metal oxide semiconductor field effect transistor, that is, MOSFET in the related art. In this case, when the power is suddenly cut off between the vehicle lead-storage battery and the lithium polymer battery using the MOSFET, counter electromotive force is generated in a direction (reverse direction) opposite to a current flow direction in the related art in a motor for a vehicle and the counter electromotive force generated in this way has a problem in that the current is conducted on a circuit through the vehicle lead-storage battery.

In general, since a rotation speed of a vehicle motor is very high, a change amount of magnetic flux passing through an inner coil of the motor also rapidly increases proportionally, and accordingly, the counter electromotive force exhibits a very high electric power amount.

That is, since the counter electromotive force conducted on the circuit corresponds to overcurrent having the very high electric power amount, when such counter electromotive force is conducted on the circuit, various elements mounted on the circuit may be damaged by the overcurrent.

In order to prevent the various elements from being damaged, a free wheeling path in which the counter electromotive force can be freely wheeled is implemented and used by using a plurality of MOSFETs is implemented in the related art. However, since a directionality of a parasitic diode is unified by one MOSFET due to a feature of the MOSFET, a direction can be controlled only in one direction. Therefore, there is a limit that multiple MOSFETs cannot but be applied in order to control a current directionality. This causes a variety of electrical problems due to the complexity of the circuit and an increase in element integration in the circuit.

Therefore, in order to solve the problems of the circuit having the free wheeling path in the related art, the present inventor has invented a system and a method for protecting a circuit between batteries, wherein counter electromotive force generated from the lead-storage battery is prevented from being applied to a MOSFET switch when power is cut off through the MOSFET switch in which a vehicle lead-storage battery and a lithium polymer battery are connected to each other to prevent a MOSFET switch from overcurrent and prevent current, which has leaked from a lead-storage battery when the lead-storage battery is charged, from being conducted to a path other than a determined path in advance.

SUMMARY

The present invention is contrived to solve the problems and an object of the present invention is to provide a system and a method for protecting a circuit between batteries, in which a counter-electromotive force generated from the lead-storage battery is prevented from being applied to a MOSFET switch when power is cut off through the MOSFET switch in a circuit in which a vehicle lead-storage battery and a lithium polymer battery are connected to each other to prevent the MOSFET switch from overcurrent and prevent current, which leaks from a lead-storage battery when the lead-storage battery is charged, from being conducted to a path other than a determined path in advance.

Among embodiments according to the present invention, a system for protecting a circuit between batteries may include: a switching unit controlling continuity between first and second batteries on a circuit formed to include the first and second batteries; and a free wheeling unit cutting off leakage current of the first battery or freely wheeling counter electromotive force of the first battery toward the first battery to protect the switching unit from the counter electromotive force.

In an embodiment, the free wheeling unit may include a silicon controlled rectifier (SCR), and a voltage detector detecting a voltage value of the first battery and outputting an operation signal for changing an operation state of the silicon controlled rectifier to an on state according to the detected voltage value.

In an embodiment, the voltage detector may determine connection directionality of the first battery through the detected voltage value and when a connection direction of the first battery is determined as not a forward direction but a reverse direction, the voltage detector may not output the operation signal.

In an embodiment, when the first battery is charged through an external charging source, the leakage current which leaks from the first battery to the free wheeling unit may be cut off by the silicon controlled rectifier.

In an embodiment, when the switching unit is opened and the continuity between the first and second batteries is changed to a short-circuit state while the silicon controlled rectifier operates in an on state, the voltage detector may output a free wheeling signal for changing an operation state of the silicon controlled rectifier from the on state to a free wheeling state so as to freely wheel the counter electromotive force output from the first battery toward the first battery through the silicon controlled rectifier.

In an embodiment, as the counter electromotive force output from the first battery is freely wheeled toward the first battery through the silicon controlled rectifier, the switching unit may be protected from the counter electromotive force.

In an embodiment, the switching unit may be a metal oxide semiconductor field effect transistor (MOSFET).

According to another embodiment of the present invention, a method for protecting a circuit between batteries may include: controlling continuity between first and second batteries on a circuit formed to include the first and second batteries through the switching unit; and cutting off leakage current of the first battery or freely wheeling counter electromotive force of the first battery toward the first battery through a free wheeling unit to protect the switching unit from the counter electromotive force.

In an embodiment, the protecting of the switching unit may include detecting, by a voltage detector, a voltage value of the first battery, and outputting an operation signal for changing an operation state of a silicon controlled rectifier to an on state according to the detected voltage value to the silicon controlled rectifier.

In an embodiment, the protecting of the switching unit may further include determining connection directionality of the first battery through the detected voltage value and when a connection direction of the first battery is determined as not a forward direction but a reverse direction, not outputting the operation signal.

In an embodiment, the protecting of the switching unit may further include cutting off, when the first battery is charged through an external charging source, the leakage current which leaks from the first battery to the free wheeling unit by the silicon controlled rectifier.

In an embodiment, the protecting of the switching unit may further include outputting, by the voltage detector, when the switching unit is opened and the continuity between the first and second batteries is changed to a short-circuit state while the silicon controlled rectifier operates in an on state, a free wheeling signal for changing an operation state of the silicon controlled rectifier from the on state to a free wheeling state so as to freely wheel the counter electromotive force output from the first battery toward the first battery through the silicon controlled rectifier.

In an embodiment, the protecting of the switching unit may further include protecting the switching unit from the counter electromotive force as the counter electromotive force output from the first battery is freely wheeled toward the first battery through the silicon controlled rectifier.

In an embodiment, the controlling of the continuity between the first and second batteries may include implementing the switching unit based on a metal oxide semiconductor field effect transistor (MOSFET).

According to an aspect of the present invention, it is advantageous that both a current directionality of counter electromotive force and the current directionality of leakage current can be controlled by implementing a free wheeling path by using a silicon controlled rectifier (SCR).

According to an aspect of the present invention, an operation state of the silicon controlled rectifier is changed from an on state to an off state only when a vehicle lead-storage battery is normally connected through a voltage detector. Therefore, the operation state of the silicon controlled rectifier is controlled even though a connection direction of a battery is changed due to carelessness of an operator to prevent malfunction.

Further, according to an aspect of the present invention, complexity of a connection circuit between the batteries is solved by eliminating application of multiple MOSFETs and the resulting element integration degree can be remarkably reduced and a cost problem caused by application of the multiple MOSFETs can also be solved.

In addition, according to an aspect of the present invention, when the lead-storage battery is charged through an external charging source, the leakage current that may leak from the lead-storage battery can be prevented from being conducted via a path other than a predetermined path in advance by using the silicon controlled rectifier (SCR).

Hereinafter, a preferred embodiment is presented in order to assist understanding of the present invention. However, the following embodiment is just provided to more easily understand the present invention and contents of the present invention are not limited by the embodiment.

Figure 1:
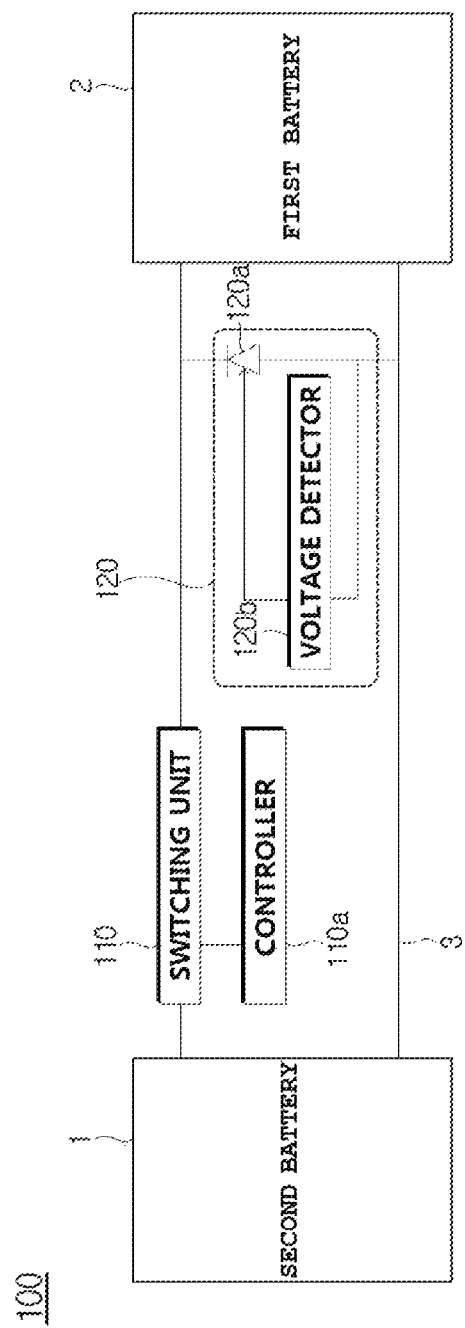
FIG. 1 is a diagram schematically illustrating a configuration of a system 100 for protecting a circuit between batteries according to an embodiment of the present invention.

FIG. 1 is a diagram schematically illustrating a configuration of a system 100 for protecting a circuit between batteries according to an embodiment of the present invention.

Referring to FIG. 1, a system 100 for protecting a circuit between batteries according to an embodiment of the present invention may be configured to include a switching unit 110 and a free wheeling unit 120.

First, the switching unit 110 may serve to control continuity between first and second batteries 1 and 2 on a circuit 3 formed to include the first and second batteries 1 and 2.

Herein, the first battery 1 may mean a vehicle lead-storage battery, which may be charged and discharged, with lead as a negative electrode (−) and lead dioxide as a positive electrode (+) using sulfuric acid as an electrolyte and the second battery 2 may mean a lithium battery which may be generally charged and discharged like a lithium polymer battery.

Further, the first battery 2 may serve to assist an output of the first battery 1 and it should be noted that if the first and second batteries 1 and 2 are batteries that may be applied to a vehicle or may be charged and discharged, types, capacities, and output amounts of the first and second batteries 1 and 2 are not limited.

Meanwhile, the switching unit 110 may perform a switching function to close or open the continuity which is a state in which the first and second batteries 1 and 2 are electrically connected to each other and as an example, the switching unit 110 may include a metal oxide semiconductor field effect transistor (MOSFET).

When the continuity of the switching unit 110 is changed from a closed state to an opened state, an electrical connection state between the first and second batteries 1 and 2 is short-circuited.

Meanwhile, when the continuity of the switching unit 110 is changed from the closed state to the opened state, counter electromotive force generated from an external motor (not illustrated) connected to the first battery 1 may be applied to the circuit 3 through the first battery 1.

Since a rotation speed of the external motor (not illustrated) is very high, a change amount of magnetic flux passing through an inner coil of the motor also rapidly increases proportionally, and accordingly, the counter electromotive force also exhibits a very high electric power amount.

That is, since the counter electromotive force conducted on the circuit 3 corresponds to overcurrent having the very high electric power amount, when such counter electromotive force is conducted on the circuit 3, various elements mounted on the circuit, in particular, the switching unit 110 such as the MOSFET may be damaged due to the counter electromotive force. Therefore, in the present invention, various elements on the circuit 3, in particular, the switching unit 110 may be protected through the free wheeling unit 120 to be described below.

Meanwhile, in the present specification, the switching unit 110 electrically connects the first and second batteries 1 and 2 and if the switching unit 110 serves to change the continuity between the first and second batteries 1 and 2, it should be noted that the type of switching unit 110 is not limited.

In an embodiment, the system 100 for protecting a circuit between batteries according to the present invention may further include a controller 110a controlling the state of the switching unit 110 to an on state or an off state by applying a switching signal to the switching unit 110.

Meanwhile, the controller 110a may generally mean a microcontroller unit (MCU) for a vehicle, which controls an on or off operation of the MOSFET provided in a battery for an electric vehicle. Since the controller 110a uses a known technique in the related art, a detailed description thereof will be omitted.

Next, the free wheeling unit 120 is connected in parallel between the first and second batteries 1 and 2 and cuts off the leakage current of the first battery 1 or freely wheels the counter electromotive force output from the first battery 1 to not the second battery 2 but the first battery 1 to serve to protect the switching unit 110.

Herein, the leakage current of the first battery 1 may mean current which leaks to a path toward the free wheeling unit 120 other than a path toward the switching unit 110 or the second battery 2 from the first battery 1 when the first battery 1 is charged through an external charging source (not illustrated).

In this case, the free wheeling unit 120 may include a silicon controlled rectifier (SCR) 120a in order to prevent the leakage current from leaking to the free wheeling unit 120.

The silicon controlled rectifier 120a may be referred to as "thyristor" and mean an element that serves to control the current directionality of large current or high voltage in which a general transistor may not be conducted.

Herein, the silicon controlled rectifier 120a as an element collectively referred to as a four-layer structure semiconductor element of internal P-N-P-N junction may have a structure in which a transistor serving as P-N-P and a transistor serving as N-P-N are coupled to each other.

In this case, since the transistor serving as the P-NP and the transistor serving as the N-P-N included in the silicon controlled rectifier 120a have different diodes each internally having unidirectional current directionality, when the current directionality of the leakage current which leaks from the first battery 1 corresponds to a direction reverse to the current directionality of each diode, the leakage current may be prevented from being input into the silicon controlled rectifier 120a.

Therefore, the leakage current cut off by the silicon controlled rectifier 120a may be supplied to the second battery 2, which may mean that the leakage current which leaks from the first battery 1 is consequently prevented from being unnecessarily consumed by the silicon controlled rectifier 120a.

Further, here, the meaning of freely wheeling the counter electromotive force output from the first battery 1 toward the first battery 1 may be interpreted as a meaning that as the operation state of the switching unit 110 is changed from the closed state to the opened state, the silicon controlled rectifier 120a is interposed in the middle to be conducted so that the counter electromotive force output from the first battery 1 may not be applied toward the second battery 2.

Meanwhile, in the present specification, the free wheeling means free wheeling, and the free wheeling unit 120 may serve to provide a free wheeling path through which the counter electromotive force may be conducted.

When the counter electromotive force may not be freely wheeled through the free wheeling unit 120, the counter electromotive force may be applied to the switching unit 110 through the second battery 2. In this case, since the switching unit 110 is in the opened state, when the counter electromotive force is applied to the opened switching unit 110, the switching unit 110 may be damaged by the counter electromotive force corresponding to the overcurrent.

Therefore, the free wheeling unit 120 may serve to freely wheel the counter electromotive force in advance and input the counter electromotive force into the first battery 1 again in order to prevent the switching unit 110 from being damaged.

Meanwhile, the free wheeling unit 120 according to an embodiment of the present invention may further include a voltage detector 120b that detects a voltage value of the first battery 1 in real time and outputs an operation signal for changing the operation state of the silicon controlled rectifier 120a from the off state to the on state according to the detected voltage value.

The voltage detector 120b measures the voltage value of the current conducted from the second battery 2 to the first battery 1 or measures the voltage value of the current of the first battery 1 when the connection direction of the first battery 1 is connected in a forward direction to serve to determine the connection directionality of the first battery 1.

For example, when the first battery 1 is connected in a reverse direction other than the forward direction, since the voltage detector 120b determines that the first battery 1 is currently connected in the reverse direction other than the forward direction because the voltage value is not detected from the first battery 1. In this case, since the operation signal is not output toward the silicon controlled rectifier 120a, the operation state of the silicon controlled rectifier 120a may be correspondingly maintained in the off state.

Therefore, when the first battery 1 is connected in the reverse direction, an unintentional operation error does not occur as the silicon control rectifier 120a is maintained in the off state.

In an embodiment, when the first battery 1 is connected in the forward direction, since the voltage detector 120b determines that the first battery 1 is currently connected in the forward direction because the voltage value is detected from the first battery 1. In this case, the operation signal is output toward the silicon controlled rectifier 120a, and as a result, the operation state of the P-N-P transistor of the silicon controlled rectifier 120a may be changed from the off state to the on state.

Meanwhile, while the P-N-P transistor in the silicon controlled rectifier 120a operates in the on state, as the switching unit 110 is opened to change the continuity between the first and second batteries 1 and 2 to a short-circuit state, when the voltage value detected through the voltage detector 120b is more than a threshold voltage value (for example, 0.6 v or more, etc.), the voltage detector 120b outputs a free wheeling signal for changing the operation state of the N-P-N transistor in the silicon controlled rectifier 120a from the off state to the on state to change the operation state of the N-P-N transistor of the silicon controlled rectifier 120a from the off state to the on state, and as a result, the free wheeling path of the free wheeling unit 120 is finally formed.

Accordingly, the counter electromotive force output from the first battery 1 is input into the first battery 1 again along the free wheeling path of the free wheeling unit 120 according to the opening of the switching unit 110, and as a result, the switching unit 110 may be prevented from being damaged due to the counter electromotive force.

Next, a schematic configuration of the silicon controlled rectifier 120a described above, a process in which the leakage current is cut off, and a process in which the counter electromotive force is freely wheeled will be described with reference to FIGS. 2A, 2B and 2C.

Figure 2A:
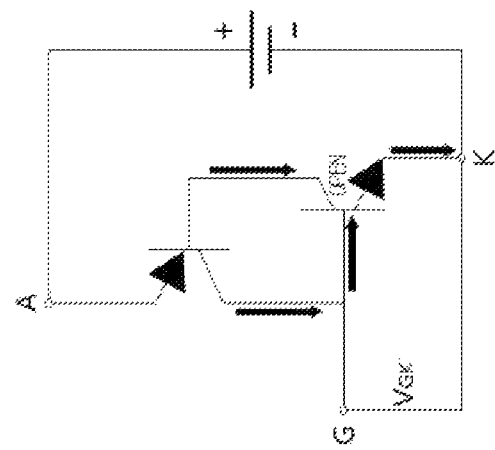
FIGS. 2A, 2B and 2C are a diagram more specifically illustrating a configuration and an operation state of a silicon controlled rectifier 120a illustrated in FIG. 1.
Figure 2B:
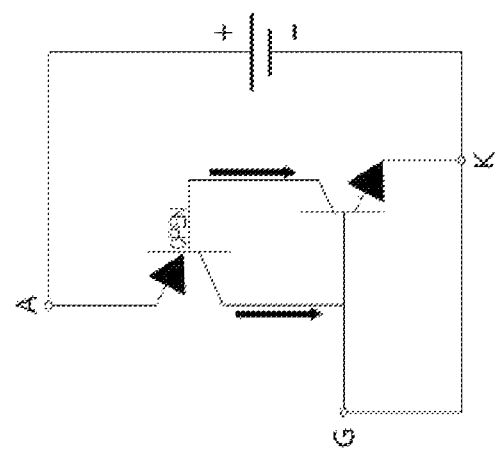
Figure 2C:
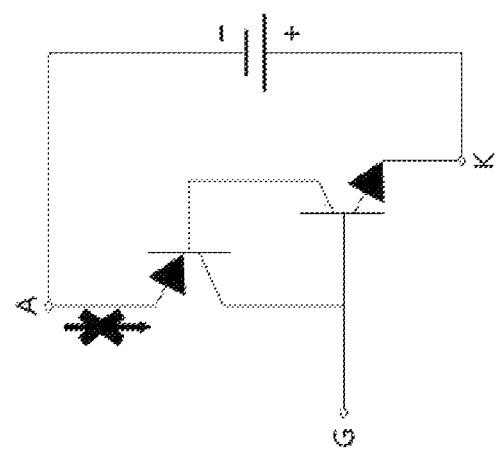

FIGS. 2A, 2B and 2C are a diagram more specifically illustrating a configuration and an operation state of a silicon controlled rectifier 120a illustrated in FIG. 1.

First, referring to FIG. 2A, FIG. 2A illustrates a case where the first battery 1 is connected in the reverse direction other than the forward direction. Since a current flow depending on connection in the reverse direction is not sensed, the voltage detector 120b does not output the operation signal for operating the silicon controlled rectifier 120a.

Referring to FIG. 2B, FIG. 2B illustrates a case where the first battery 1 is connected in the forward direction. Since the current flow depending on connection in the forward direction is sensed, the voltage detector 120b outputs the operation signal for operating the silicon controlled rectifier 120a, and as a result, the operation state of the P-N-P transistor in the silicon controlled rectifier 120a is changed to the on state. In this case, the N-P-N transistor is currently in the closed state.

Referring to FIG. 2C, FIG. 2C illustrates a case where while the first battery 1 is connected in the forward direction, the switching unit 110 is opened and the continuity between the first and second batteries 1 and 2 are the short-circuit state. Since the counter electromotive force (0.6 V or more) depending on the opening of the switching unit 110 is detected, the voltage detector 120b outputs the free wheeling signal for operating the N-P-N transistor of the silicon controlled rectifier 120a, and as a result, the operation state of the N-P-N transistor in the silicon controlled rectifier 120a is changed to the on state. In this case, since both the P-N-P transistor and the N-P-N transistor are in the closed state, the counter electromotive force is conducted along a path from 'A' to 'K' illustrated in FIG. 2C to be freely wheeled to the first battery 1.

Next, an operation order of the system 100 for protecting a circuit between batteries according to the present invention will be described with reference to FIG. 3.

Figure 3:
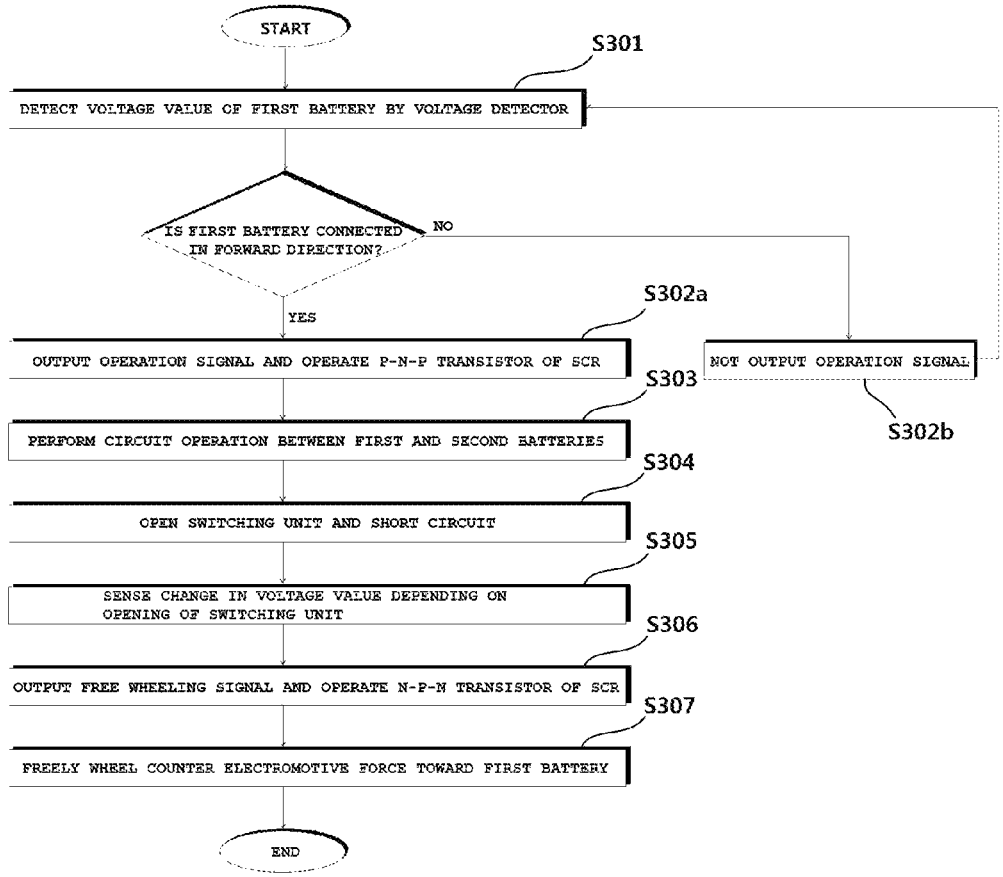
FIG. 3 is a diagram schematically illustrating an operation order of the system 100 for protecting a circuit between batteries according to an embodiment of the present invention.

FIG. 3 is a diagram schematically illustrating an operation order of the system 100 for protecting a circuit between batteries according to an embodiment of the present invention.

Referring to FIG. 3, first, when the first battery 1 is connected, the voltage value of the first battery 1 is detected through the voltage detector 120b (S301).

In this case, the voltage detector 120b may determine the directionality indicating whether the first battery 1 is currently connected in the forward direction or in the reverse direction based on the detected voltage value. When the first battery 1 is connected in the forward direction, the operation signal is output to the silicon controlled rectifier 120a, and as a result, the P-N-P transistor in the silicon controlled rectifier 120a operates (S302a) and when the first battery 1 is connected in the reverse direction, the operation signal is not output and the operation state of the silicon controlled rectifier 120a is maintained in the off state until the first battery 1 is connected in the forward direction (S302b).

After step S302a, as the continuity of the switching unit 110 is changed to the closed state, the current is conducted on the circuit 3 including the first and second batteries 1 and 2, and as a result, a circuit operation may be performed (S303).

Then, when driving of the vehicle is terminated or external power is short-circuited, the switching unit 110 is opened, and as a result, the circuit is shorted (S304) and the voltage detector 120b detects a change in voltage value depending on the opening of the switching unit 110 (S305).

Then, the voltage detector 120b outputs the free wheeling signal to the silicon controlled rectifier 120a to operate the N-P-N transistor in the silicon controlled rectifier 120a (S306).

Therefore, the counter electromotive force output from the first battery 1 may be freely wheeled toward the first battery 1 through the free wheeling path formed through step S306 (S307), and as a result, the switching unit 110 connected with the second battery 2 may be protected from the counter electromotive force.

The present invention has been described with reference to the preferred embodiments, but those skilled in the art will understand that the present invention can be variously modified and changed without departing from the spirit and the scope of the present invention which are defined in the appended claims.

The invention claimed is:

1. A system for protecting a circuit between batteries, the system comprising:
    a switching unit controlling continuity between first and second batteries on a circuit formed to include the first and second batteries; and
    a free wheeling unit cutting off leakage current of the first battery or freely wheeling counter electromotive force of the first battery toward the first battery to protect the switching unit from the counter electromotive force,
    wherein the free wheeling unit includes a silicon controlled rectifier (SCR) and a voltage detector detecting a voltage value of the first battery and outputting an operation signal for changing an operation state of the silicon controlled rectifier to an on state according to the detected voltage value, and
    wherein when the first battery is charged through an external charging source, the leakage current which leaks from the first battery to the free wheeling unit is cut off by the silicon controlled rectifier.

2. The system of claim 1, wherein the voltage detector determines connection directionality of the first battery through the detected voltage value and when a connection direction of the first battery is determined as not a forward direction but a reverse direction, the voltage detector does not output the operation signal.

3. The system of claim 1, wherein when the switching unit is opened and the continuity between the first and second batteries is changed to a short-circuit state while the silicon controlled rectifier operates in an on state, the voltage detector outputs a free wheeling signal for changing an operation state of the silicon controlled rectifier from the on state to a free wheeling state so as to freely wheel the counter electromotive force output from the first battery toward the first battery through the silicon controlled rectifier.

4. The system of claim 3, wherein as the counter electromotive force output from the first battery is freely wheeled toward the first battery through the silicon controlled rectifier, the switching unit is protected from the counter electromotive force.

5. The system of claim 1, wherein the switching unit is a metal oxide semiconductor field effect transistor (MOSFET).

6. A method for protecting a circuit between batteries, the method comprising:
controlling continuity between first and second batteries through a switching unit on a circuit formed to include the first and second batteries; and
cutting off leakage current of the first battery or freely wheeling counter electromotive force of the first battery toward the first battery to protect the switching unit from the counter electromotive force through a free wheeling unit,
wherein the protecting of the switching unit includes detecting, by a voltage detector, a voltage value of the first battery, and outputting an operation signal for changing an operation state of a silicon controlled rectifier according to the detected voltage value to an on state to the silicon controlled rectifier, and
wherein the protecting of the switching unit further includes cutting off, when the first battery is charged through an external charging source, the leakage current which leaks from the first battery to the free wheeling unit by the silicon controlled rectifier.

7. The method of claim 6, wherein the protecting of the switching unit further includes determining connection directionality of the first battery through the detected voltage value and when a connection direction of the first battery is determined as not a forward direction but a reverse direction, not outputting the operation signal.

8. The method of claim 6, wherein the protecting of the switching unit further includes outputting, by the voltage detector, when the switching unit is opened and the continuity between the first and second batteries is changed to a short-circuit state while the silicon controlled rectifier operates in an on state, a free wheeling signal for changing an operation state of the silicon controlled rectifier from the on state to a free wheeling state so as to freely wheel the counter electromotive force output from the first battery toward the first battery through the silicon controlled rectifier.

9. The method of claim 8, wherein the protecting of the switching unit further includes protecting the switching unit from the counter electromotive force as the counter electromotive force output from the first battery is freely wheeled toward the first battery through the silicon controlled rectifier.

10. The method of claim 6, wherein the controlling of the continuity between the first and second batteries includes implementing the switching unit based on a metal oxide semiconductor field effect transistor (MOSFET).

11. A system for protecting a circuit between first and second batteries, the system comprising:
a switching unit configured to control a connection between the first and second batteries; and
a free-wheeling unit configured to avoid a current flowing from the first battery along the circuit in a reverse direction toward at least one of the free-wheeling circuit and the switching unit,
wherein the free-wheeling unit includes a silicon controlled rectifier (SCR) configured to, in response to (i) detection of current flowing from the second battery along the circuit in a forward direction opposite the reverse direction being connected to the first battery in a forward direction, and (ii) detection of the current flowing from the first battery in the reverse direction, permit current flow through the SCR.

12. The system of claim 11, wherein the first battery is connected to a motor, and wherein the current flowing from the first battery in the reverse direction is generated by disconnection of the first battery from the second battery.

13. The system of claim 12, wherein the current flowing from the first battery in the reverse direction is a leakage current flowing in a direction toward the free-wheeling unit, and wherein the free-wheeling unit is configured to cut off the leakage current.

14. The system of claim 12, wherein the current flowing from the first battery in the reverse direction is generated by a counter-electromotive force and is flowing in a direction toward the switching unit and toward the second battery, and wherein the free-wheeling unit is configured to free-wheel the current generated by the counter-electromotive force back toward the first battery.

15. The system of claim 11, wherein the SCR is configured to, in response to detection of the second battery generating a current along the circuit in the reverse direction, avoid switching to an ON state in response to detection of the current flowing from the first battery in the reverse direction.

* * * * *